US011239233B2

(12) United States Patent
Wu et al.

(10) Patent No.: US 11,239,233 B2
(45) Date of Patent: Feb. 1, 2022

(54) INTEGRATED CIRCUIT PACKAGES AND METHODS OF FORMING SAME

(71) Applicant: Taiwan Semiconductor Manufacturing Company, Ltd., Hsinchu (TW)

(72) Inventors: Yi-Wen Wu, Xizhi (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/561,561

(22) Filed: Sep. 5, 2019

(65) Prior Publication Data
US 2019/0393216 A1 Dec. 26, 2019

Related U.S. Application Data

(63) Continuation of application No. 15/946,885, filed on Apr. 6, 2018, now Pat. No. 10,872,885.
(Continued)

(51) Int. Cl.
*H01L 25/065* (2006.01)
*H01L 27/06* (2006.01)
(Continued)

(52) U.S. Cl.
CPC ...... *H01L 27/0688* (2013.01); *G01R 31/2886* (2013.01); *G01R 31/2896* (2013.01); *H01L 21/6835* (2013.01); *H01L 21/8221* (2013.01); *H01L 23/3157* (2013.01); *H01L 24/13* (2013.01); *H01L 24/16* (2013.01); *H01L 25/0652* (2013.01); *H01L 25/0657* (2013.01); *H01L 25/105* (2013.01); *H01L 25/50* (2013.01); *H01L 21/561* (2013.01); *H01L 23/3128* (2013.01); *H01L 2221/68345* (2013.01);
(Continued)

(58) Field of Classification Search
CPC ................................................. H01L 25/0655
USPC ........................................................ 438/127
See application file for complete search history.

(56) References Cited

U.S. PATENT DOCUMENTS 9,000,584 B2    4/2015  Lin et al.
9,048,222 B2 *  6/2015  Hung .................... H01L 23/528
(Continued)

FOREIGN PATENT DOCUMENTS

CN    102194705 A    9/2011
CN    106688094 A    5/2017
(Continued)

*Primary Examiner* — Hsin Yi Hsieh
(74) *Attorney, Agent, or Firm* — Slater Matsil, LLP

(57) ABSTRACT

An integrated circuit package and a method of forming the same are provided. A method includes attaching a first side of an integrated circuit die to a carrier. An encapsulant is formed over and around the integrated circuit die. The encapsulant is patterned to form a first opening laterally spaced apart from the integrated circuit die and a second opening over the integrated circuit die. The first opening extends through the encapsulant. The second opening exposes a second side of the integrated circuit die. The first side of the integrated circuit die is opposite the second side of the integrated circuit die. A conductive material is simultaneously deposited in the first opening and the second opening.

20 Claims, 17 Drawing Sheets

Related U.S. Application Data

(60) Provisional application No. 62/527,668, filed on Jun. 30, 2017.

(51) Int. Cl.

| | | |
|---|---|---|
| *H01L 23/00* | (2006.01) | |
| *H01L 23/31* | (2006.01) | |
| *G01R 31/28* | (2006.01) | |
| *H01L 21/822* | (2006.01) | |
| *H01L 21/683* | (2006.01) | |
| *H01L 25/10* | (2006.01) | |
| *H01L 25/00* | (2006.01) | |
| *H01L 21/56* | (2006.01) | |

(52) U.S. Cl.
CPC .............. *H01L 2221/68359* (2013.01); *H01L 2224/023* (2013.01); *H01L 2224/0401* (2013.01); *H01L 2224/48091* (2013.01); *H01L 2224/48227* (2013.01); *H01L 2225/0651* (2013.01); *H01L 2225/06562* (2013.01); *H01L 2225/107* (2013.01); *H01L 2225/1047* (2013.01); *H01L 2924/15311* (2013.01); *H01L 2924/181* (2013.01); *H01L 2924/1811* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2007/0052086 A1 | 3/2007 | Oi et al. | |
| 2011/0227223 A1 | 9/2011 | Wu et al. | |
| 2012/0211892 A1* | 8/2012 | Kim | H01L 21/561 257/774 |
| 2014/0070403 A1 | 3/2014 | Pan et al. | |
| 2014/0131858 A1 | 5/2014 | Pan et al. | |
| 2014/0367848 A1 | 12/2014 | Chi et al. | |
| 2015/0145142 A1 | 5/2015 | Lin et al. | |
| 2016/0093571 A1 | 3/2016 | Kim et al. | |
| 2016/0172329 A1 | 6/2016 | Chang et al. | |
| 2016/0317068 A1 | 11/2016 | Pepin et al. | |
| 2016/0329307 A1 | 11/2016 | Tsai et al. | |
| 2017/0033080 A1 | 2/2017 | Chen et al. | |
| 2017/0084589 A1 | 3/2017 | Kuo et al. | |
| 2018/0033732 A1 | 2/2018 | Sakamoto et al. | |
| 2018/0119305 A1 | 5/2018 | Brogan et al. | |

FOREIGN PATENT DOCUMENTS

| | | |
|---|---|---|
| KR | 20140061959 A | 5/2014 |
| KR | 20150059635 A | 6/2015 |
| TW | 201145478 A | 12/2011 |
| TW | 201705392 A | 2/2017 |
| TW | 201705910 A | 2/2017 |
| TW | 201712828 A | 4/2017 |

\* cited by examiner

INTEGRATED CIRCUIT PACKAGES AND METHODS OF FORMING SAME

PRIORITY CLAIM AND CROSS-REFERENCE

This application is a continuation of U.S. application Ser. No. 15/946,885, filed on Apr. 6, 2018, entitled "Integrated Circuit Packages and Methods of Forming Same," which claims the benefit of U.S. Provisional application Ser. No. 62/527,668, filed on Jun. 30, 2017, entitled "Integrated Circuit Packages and Methods of Forming Same," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
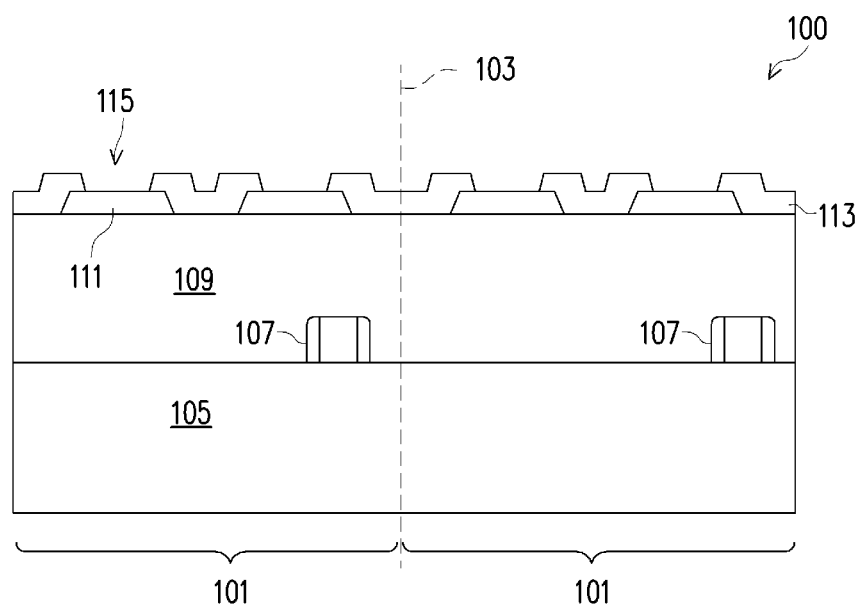
FIGS. 1-8 are cross-sectional views of various processing steps during fabrication of integrated circuit dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package such as an integrated fan-out (InFO) package and a PoP package comprising an InFO package. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component. Various embodiments described herein allow for forming through encapsulant vias and redistribution lines of an integrated circuit package in a same process step, which allows for reducing the number of process steps for forming the integrated circuit package and reducing manufacturing costs.

FIGS. 1-8 are cross-sectional views of various processing steps during fabrication of integrated circuit dies in accordance with some embodiments. Referring to FIG. 1, a portion of a workpiece 100 having die regions 101 separated by scribe lines 103 (also referred to as dicing lines or dicing streets) is illustrated. As described below in greater detail, the workpiece 100 will be diced along the scribe lines 103 to form individual integrated circuit dies (such as integrated circuit dies 801 illustrated in FIG. 8). In some embodiments, the workpiece 100 comprises a substrate 105, one or more active and/or passive devices 107 on the substrate 105, and one or more metallization layers 109 over the substrate 105 and the one or more active and/or passive devices 107. In some embodiments, the substrate 105 may be formed of silicon, although it may also be formed of other group III, group IV, and/or group V elements, such as silicon, germanium, gallium, arsenic, and combinations thereof. The substrate 105 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the one or more active and/or passive devices 107 may include various n-type metal-oxide semiconductor (NMOS) and/or p-type metal-oxide semiconductor (PMOS) devices such as transistors, capacitors, resistors, diodes, photo-diodes, fuses and/or the like.

The one or more metallization layers 109 may include an inter-layer dielectric (ILD)/inter-metal dielectric layers (IMDs) formed over the substrate 105 and the one or more active and/or passive devices 107. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), the like, or a combination thereof. In some embodiments, interconnect structures may be formed in the ILD/IMDs using, for example, a damascene process, a dual damascene process, a combination thereof, or the like. In some embodiments, interconnect structures may comprise copper, a copper alloy, silver, gold, tungsten, tantalum, aluminum, or the like. In some embodiments, the interconnect structures may provide electrical connections between the one or more active and/or passive devices 107 formed on the substrate 105.

In some embodiments, contact pads 111 are formed over the one or more metallization layers 109. The contact pads 111 may be electrically coupled to the one or more active and/or passive devices 107 through the one or more metallization layers 109. In some embodiments, the contact pads 111 may comprise a conductive material such as aluminum, copper, tungsten, silver, gold, the like, or a combination thereof. In some embodiments, a conductive material may be formed over the one or more metallization layers 109 using, for example, physical vapor deposition (PVD), atomic layer deposition (ALD), electro-chemical plating, electroless plating, the like, or a combination thereof. Subsequently, the conductive material is patterned to form the contact pads 111. In some embodiments, the conductive material may be patterned using photolithography techniques. Generally, photolithography techniques involve depositing a photoresist material (not shown), which is subsequently irradiated (exposed) and developed to remove a portion of the photoresist material. The remaining photoresist material protects the underlying material, such as the conductive material of the contact pads 111 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the contact pads 111. In some embodiments wherein the conductive material is aluminum, the conductive material may be etched using, for example, a mixture of 80% phosphoric acid, 5% nitric acid, 5% acetic acid, and 10% de-ionized (DI) water. Subsequently, the photoresist material may be removed using, for example, an ashing process followed by a wet clean process.

Referring further to FIG. 1, a passivation layer 113 is formed over the substrate 105 and the contact pads 111. In some embodiments, the passivation layer 113 may comprise one or more layers of non-photo-patternable dielectric materials such as silicon nitride, silicon oxide, phosphosilicate glass (PSG), borosilicate glass (BSG), boron-doped phosphosilicate glass (BPSG), a combination thereof, or the like, and may be formed using chemical vapor deposition (CVD), PVD, ALD, a spin-on coating process, a combination thereof, or the like. In other embodiments, the passivation layer 113 may comprise one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable dielectric materials may be patterned using similar photolithography methods as a photoresist material.

The openings 115 are formed in the passivation layer 113 to expose portions of the contact pads 111. In some embodiments where the passivation layer 113 comprises a non-photo-patternable dielectric material, the passivation layer 113 may be patterned using suitable photolithography and etching methods. In some embodiments, a photoresist material (not shown) is formed over the passivation layer 113. The photoresist material is subsequently irradiated (exposed) and developed to remove a portion of the photoresist material. Subsequently, exposed portions of the passivation layer 113 are removed using, for example, a suitable etching process to form the openings 115. In some embodiments, the passivation layer 113 formed of silicon oxide may be etched using, for example, buffered hydrofluoric acid (HF). In other embodiments, the passivation layer 113 formed of silicon nitride may be etched using, for example, hot phosphoric acid ($H_3PO_4$).

Figure 2:
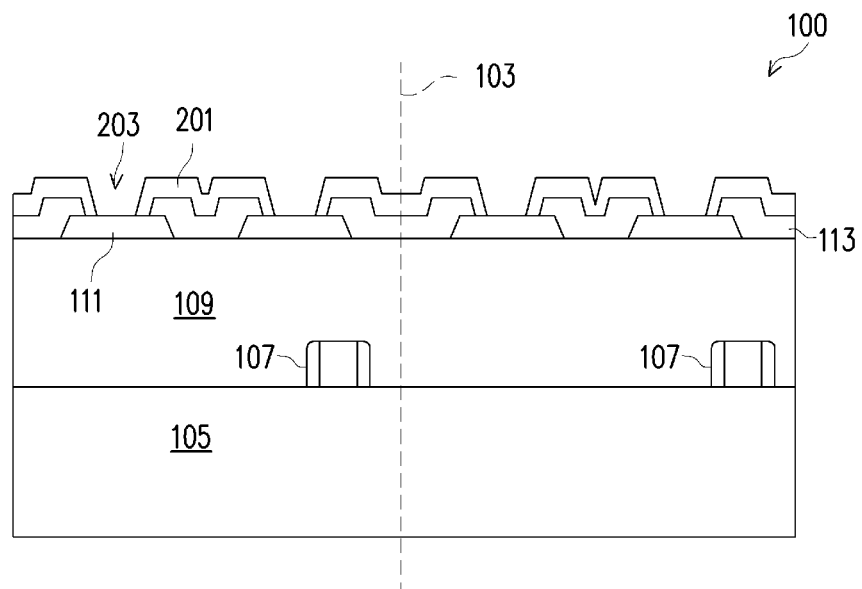

Referring to FIG. 2, a buffer layer 201 is formed over the passivation layer 113 and the contact pads 111. In some embodiments, the buffer layer 201 may comprise one or more layers of photo-patternable insulating materials such as polybenzoxazole (PBO), polyimide (PI), benzocyclobutene (BCB), a combination thereof, or the like, and may be formed using a spin-on coating process, or the like. In some embodiments, the buffer layer 201 is patterned to form openings 203 and expose the contact pads 111. In some embodiments, the openings 203 may be formed using suitable photolithography techniques to expose the buffer layer 201 to light. The buffer layer 201 is developed and/or cured after the exposure.

Figure 3:
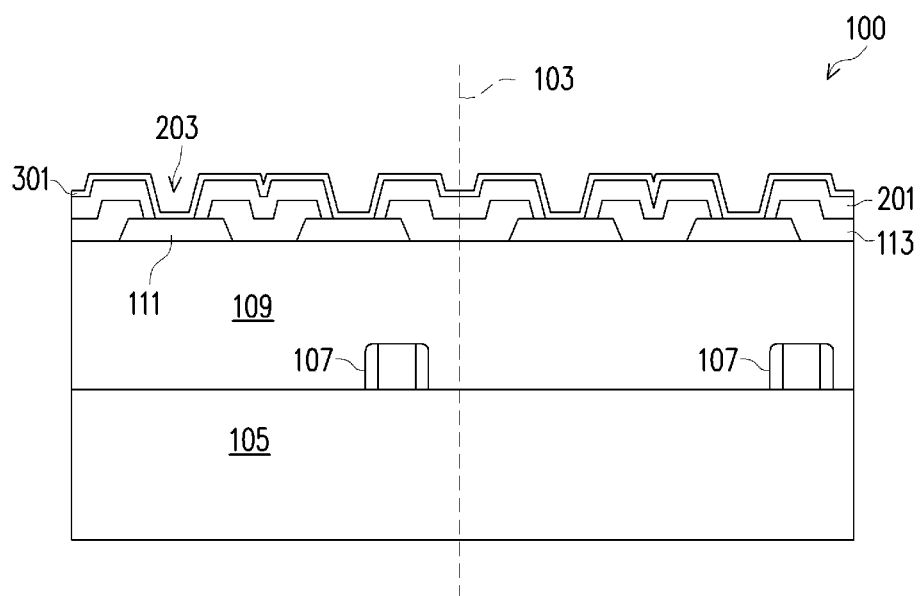

Referring to FIG. 3, a seed layer 301 is blanket deposited over the buffer layer 201 and in the openings 203. The seed layer 301 may comprise one or more layers of copper, titanium, nickel, gold, manganese, a combination thereof, or the like, and may be formed by ALD, PVD, sputtering, a combination thereof, or the like. In some embodiments, the seed layer 301 comprises a layer of copper formed over a layer of titanium.

Figure 4:
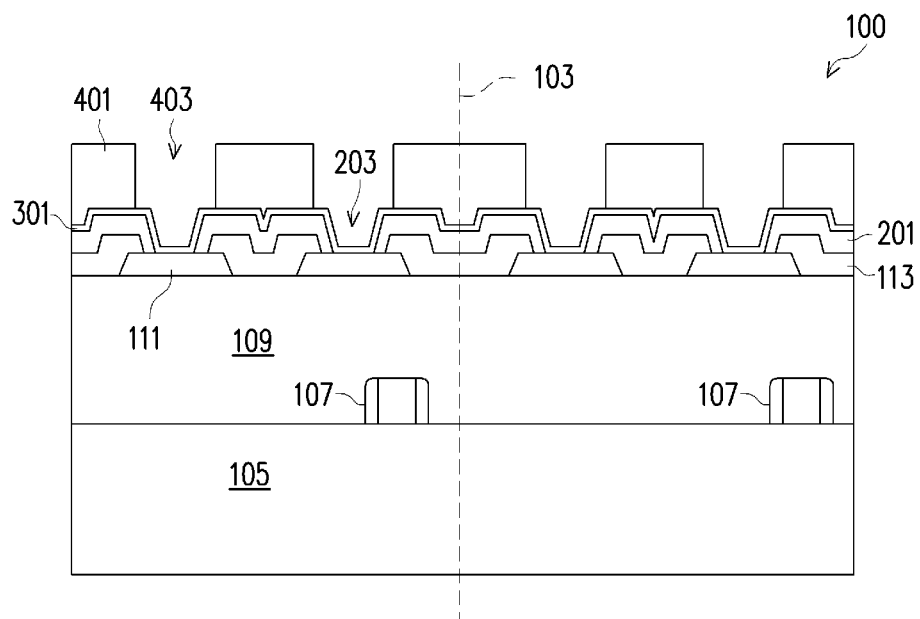

Referring FIG. 4, a patterned mask 401 is formed over the seed layer 301. In some embodiments, the patterned mask 401 may comprise a photoresist material, or any photo-patternable material. In some embodiments, a material of the patterned mask 401 is deposited, irradiated (exposed) and developed to remove portions of the material and form openings 403, thereby forming the patterned mask 401. In the illustrated embodiment, the openings 403 expose portions of the seed layer 301 formed over the contact pads 111 in the openings 203. As discussed in greater detail below, conductive pillars (such as conductive pillars 501 illustrated in FIG. 5) will be formed in the openings 403 to provide electrical connections to the contact pads 111.

Figure 5:
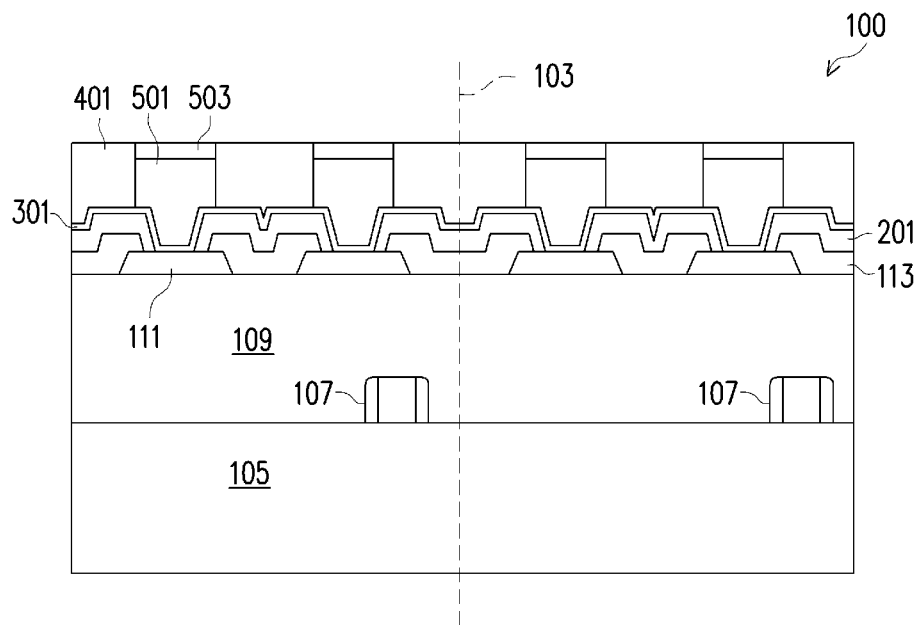

Referring to FIG. 5, conductive pillars 501 are formed in combined openings formed of the openings 403 and 203 (see FIG. 4). In some embodiments, the combined openings are filled with a conductive material such as copper, tungsten, aluminum, silver, gold, a combination thereof, or the like, using an electro-chemical plating process, an electroless plating process, ALD, PVD, a combination thereof, or the like to form the conductive pillars 501. In some embodiments, the conductive pillars 501 partially fill the combined openings and remaining portions of the combined openings are filled with a solder material to form solder layers 503 over the respective conductive pillars 501. In some embodiments, the suitable solder materials may be lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu). In some embodiments, the solder layers 503 may be formed using evaporation, an electro-chemical plating process, an electroless plating process, printing, solder transfer, a combination thereof, or the like.

Figure 6:
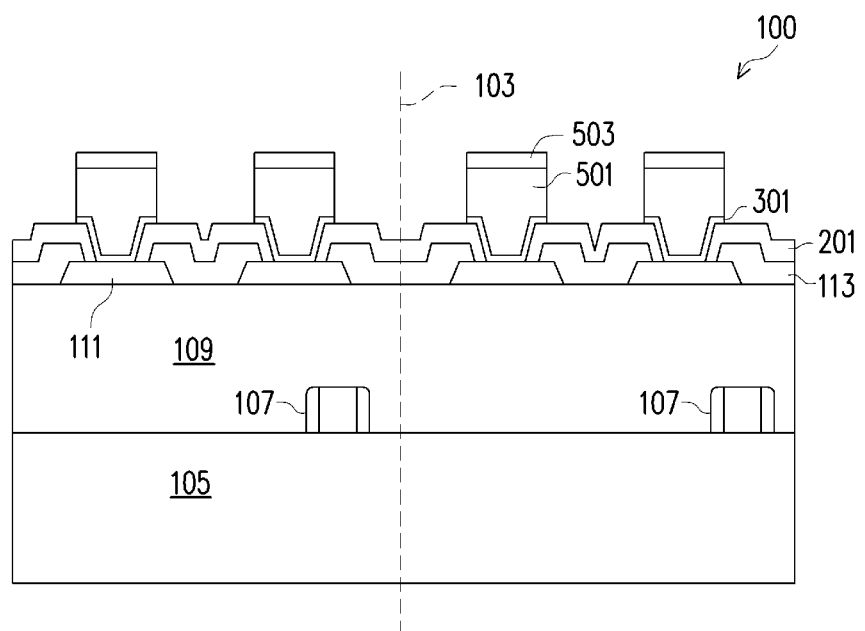

Referring to FIG. 6, after forming the conductive pillars 501 and the solder layers 503, the patterned mask 401 (see FIG. 5) is removed. In some embodiments, the patterned mask 401 comprising a photoresist material may be removed using, for example, an ashing process followed by a wet clean process. Subsequently, exposed portions of the seed layer 301 are removed using, for example, a suitable etching process. In an embodiment where the seed layer 301 comprises a copper layer formed over a titanium layer, the seed layer 301 may be etched using, for example, a mixture of $FeCl_3$, HCl, and $H_2O$ (for etching copper) and a mixture of $H_2O_2$, HF, and $H_2O$ (for etching titanium).

Figure 7:
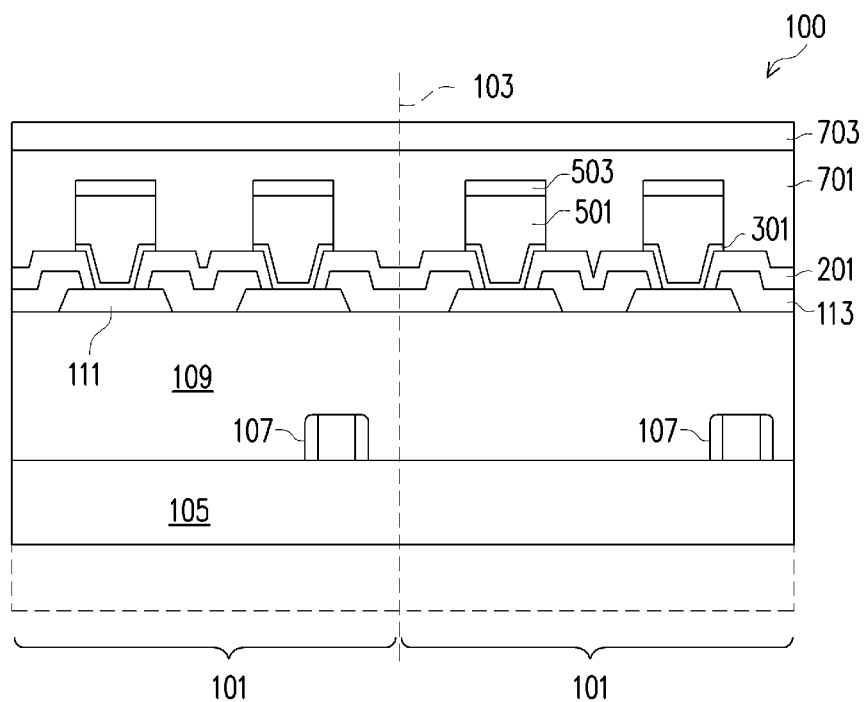

Referring to FIG. 7, a protective layer 701 is formed over and surrounding the conductive pillars 501 and corresponding solder layers 503. In some embodiments, the protective layer 701 may comprise one or more layers of photo-patternable insulating materials such as polybenzoxazole (PBO), polyimide (PI), benzocyclobutene (BCB), a combination thereof, or the like, and may be formed using a spin-on coating process, or the like. In some embodiments, before forming the protective layer 701, each of the die regions 101 may be tested to identify known good dies (KGDs) for further processing.

Referring further to FIG. 7, in some embodiments, it is desirable to back grind the substrate 105, for example, to reduce the thickness of the workpiece 100, and thicknesses of subsequently formed integrated circuit dies. In such embodiments, a thinning process is performed, where a tape 703 such as a back grinding (BG) tape is applied to a top surface of the protective layer 701, and the back side of the substrate 105 is thinned by grinding, etching, a CMP process, a combination thereof, or the like. In some embodiments, the tape 703 protects the workpiece 100 from contamination caused by grinding fluids and/or debris.

Figure 8:
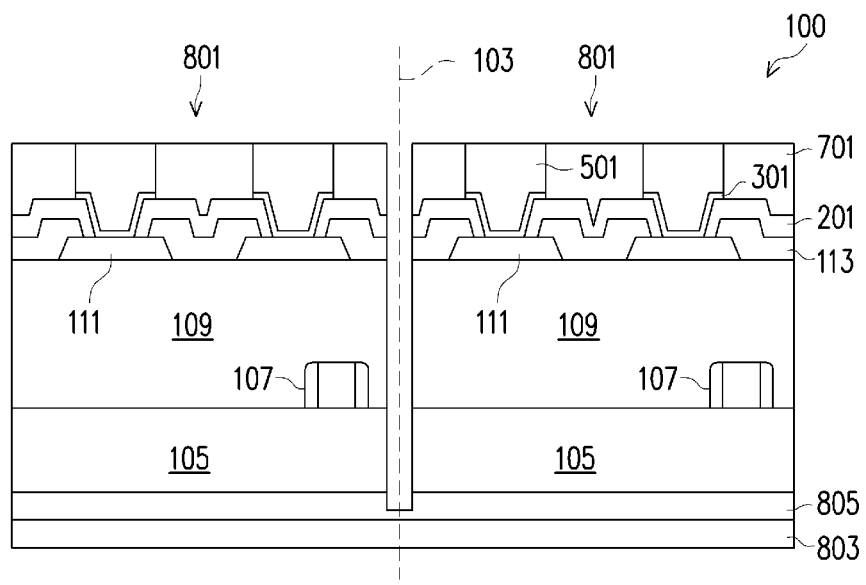

Referring to FIG. 8, in some embodiments, after the thinning process described above is completed, the tape 703 is removed and the protective layer 701 is planarized using a CMP process, a grinding process, an etching process, a combination thereof, or the like. In some embodiments, the planarization process is performed until the conductive pillars 501 are exposed. In some embodiment, the planarization process may also remove the solder layers 503 (see FIG. 7) over the conductive pillars 501. In some embodiments, top surfaces the conductive pillars 501 are substantially coplanar with a top surface of the protective layer 701.

Referring further to FIG. 8, in some embodiments, after the planarization process described above is completed, the workpiece 100 is singulated to form individual dies 801. In some embodiments, the workpiece 100 may be attached to a frame 803 using an adhesive 805 to prepare the workpiece 100 for a subsequent dicing process. In some embodiments, the frame 803 may be a film frame or any suitable carrier to provide mechanical support for subsequent operations, such as dicing. The adhesive 805 may be a die attach film, a dicing film, or any suitable adhesive, epoxy, ultraviolet (UV) glue (which loses its adhesive property when exposed to UV radiation), or the like, and may be formed using a deposition process, a spin coating, a printing process, a lamination process, or the like. In some embodiments, the adhesive 805 may have a multilayer structure and may comprise a release layer (not show). The release layer may help to safely remove individual dies 801 from the frame 803 after the dicing process is completed. In some embodiments, the release layer may be a UV type, wherein adhesive strength of the release layer is substantially reduced after exposing the release layer to UV radiation. In other embodiments, the release layer may be a thermal type, wherein adhesive strength of the release layer is substantially reduced after exposing the release layer to a suitable heat source. In some embodiments, the workpiece 100 may be singulated into individual dies 801, for example, by sawing, laser ablation, a combination thereof, or the like.

As shown in FIG. 8, each integrated circuit die 801 comprises a single passivation layer (such as the passivation layer 113), a single buffer layer (such as the buffer layer 201), two contact pads (such as the contact pads 111), two conductive pillars (such as the conductive pillars 501), and a single protective layer (such as the protective layer 701). One skilled in the art will recognize that the numbers of passivation layers, buffer layers, contact pads, conductive pillars, and the protective layers are provided for illustrative purpose only and are not limiting the scope of the present disclosure. In other embodiments, each integrated circuit die 801 may comprise the appropriate number of passivation layers, buffer layers, contact pads, conductive pillars, and protective layers depending on design requirements for the integrated circuit dies 801.

Figure 9:
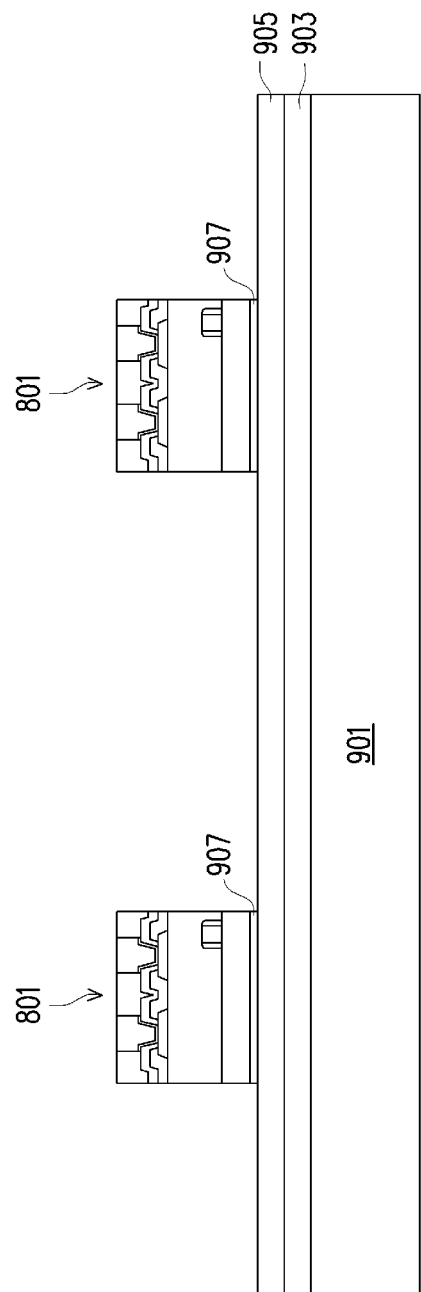
FIGS. 9-16 are cross-sectional views of various processing steps during fabrication of integrated circuit packages in accordance with some embodiments.

FIGS. 9-16 are cross-sectional views of various processing steps during fabrication of integrated circuit packages using the integrated circuit dies 801 fabricated in FIGS. 1-8 in accordance with some embodiments. Referring first to FIG. 9, in some embodiments, a release layer 903 is formed over a carrier 901, and an insulating layer 905 is formed over the release layer 903 to start forming integrated circuit packages. In some embodiments, the carrier 901 may be formed of quartz, glass, or the like, and provides mechanical support for subsequent operations. In some embodiments, the release layer 903 may comprise a light to heat conversion (LTHC) material, a UV adhesive, a polymer layer, or the like, and may be formed using a spin-on coating process, a printing process, a lamination process, or the like. In some embodiments where the release layer 903 is formed of a LTHC material, the release layer 903 when exposed to light partially or fully loses its adhesive strength and the carrier 901 can be easily removed from a back side of a subsequently formed structure. In some embodiments, the insulating layer 905 may be formed using similar materials and methods as the buffer layer 201 described above with reference to FIG. 2, and the description is not repeated herein for the sake of brevity.

Referring further to FIG. 9, integrated circuit dies 801 are attached to the insulating layer 905 using adhesive layers 907. In some embodiments, the integrated circuit dies 801 are placed on the insulating layer 905 using, for example, a pick-and-place apparatus. In other embodiments, the integrated circuit dies 801 may be placed on the insulating layer 905 manually, or using any other suitable method. In some embodiments, the adhesive layer 907 may comprise an LTHC material, a UV adhesive, a die attach film, or the like, and may be formed using a spin-on coating process, a printing process, a lamination process, or the like.

Figure 10:
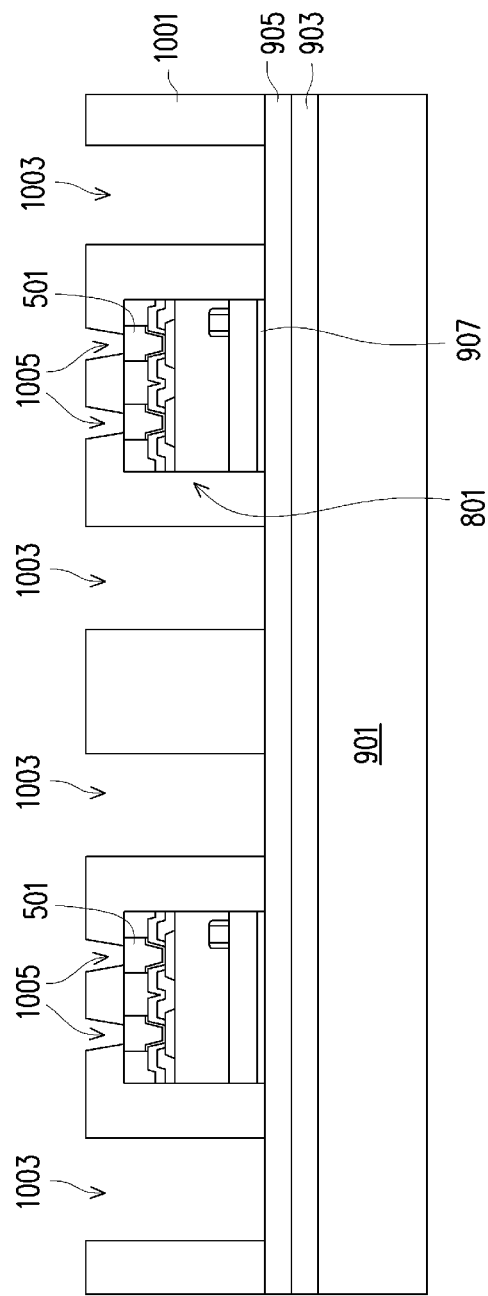

Referring to FIG. 10, an encapsulant 1001 is formed over the insulating layer 905, and over and surrounding the integrated circuit dies 801. In some embodiments, the encapsulant 1001 may comprise one or more layers of photo-patternable insulating materials such as polybenzoxazole (PBO), polyimide (PI), benzocyclobutene (BCB), a combination thereof, or the like, and may be formed using a spin-on coating process, or the like. In some embodiments, the encapsulant 1001 is patterned to form openings 1003 and 1005 in the encapsulant 1001. In some embodiments, the openings 1003 and 1005 may be formed using suitable photolithography techniques to expose the encapsulant 1001 to light. The encapsulant 1001 is developed and/or cured after the exposure. In some embodiments, the openings 1003 extend through the encapsulant 1001 and expose the insulating layer 905. In some embodiments, the openings 1005 expose the conductive pillars 501 of the integrated circuit dies 801. As described below in greater detail, through encapsulant vias are formed in the openings 1003 and redistribution layer vias are formed in the openings 1005 (see FIG. 13).

Figure 11:
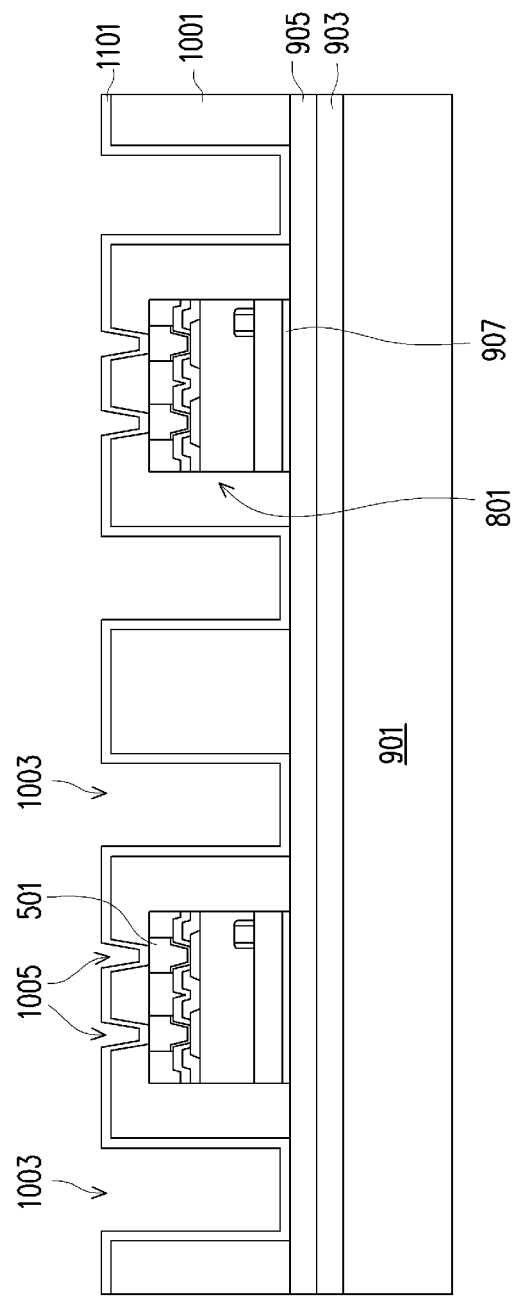

Referring to FIG. 11, a seed layer 1101 is formed over the encapsulant 1001 and in the openings 1003 and 1005. In some embodiments, the seed layer 1101 may be formed using similar materials and methods as the seed layer 301 described above with reference to FIG. 3, and the description is not repeated herein for the sake of brevity. In some embodiments, the seed layer 1101 may have a thickness between about 500 Å and about 1 µm. In some embodiments, the seed layer 1101 may comprise a layer of copper formed over a layer of titanium. In some embodiment, the layer of titanium may have a thickness between about 100 Å and about 1000 Å. In some embodiment, the layer of copper may have a thickness between about 300 Å and about 9000 Å.

Figure 12:
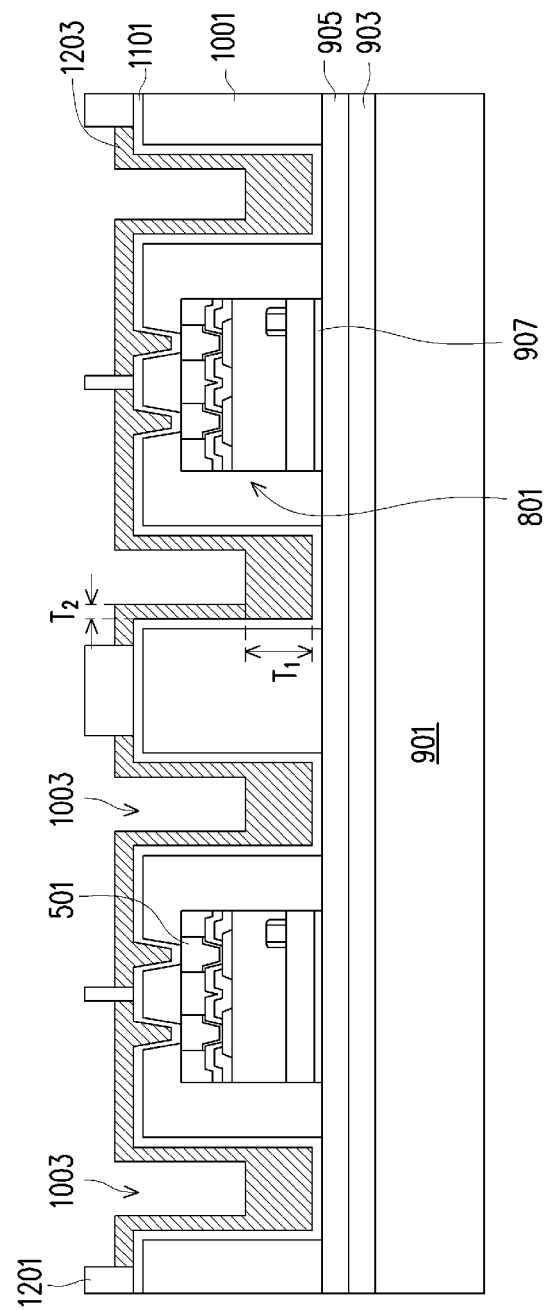

Referring to FIG. 12, a patterned mask 1201 having openings therein is formed over the encapsulant 1001. In some embodiments, the patterned mask 1201 may be formed using similar materials and methods as the patterned mask 401 described above with reference to FIG. 4, and the description is not repeated herein for the sake of brevity. Subsequently, a conductive material 1203 is deposited through the openings in the patterned mask 1201. In some embodiments, the conductive material 1203 may comprise copper, tungsten, aluminum, silver, gold, a combination thereof, or the like, and may be formed using an electro-chemical plating process, an electroless plating process, ALD, PVD, a combination thereof, or the like. In some embodiments, the conductive material 1203 may fully fill the openings 1005 (see FIG. 11). In some embodiments, the conductive material 1203 may partially fill the openings 1003. In some embodiments, the conductive material 1203 is formed in the openings 1003 in a non-conformal manner such that a thickness $T_1$ of the conductive material 1203 disposed on bottoms of the openings 1003 is greater than a thickness $T_2$ of the conductive material 1203 disposed on sidewalls of the openings 1003. In some embodiments, the thickness $T_2$ is between about 2 µm and about 10 µm. In some embodiments, the thickness $T_1$ is between about 12 µm and about 60 µm. In some embodiments, bottoms of unfilled portions of the openings 1003 may be below the topmost surface of the integrated circuit dies 801. In some embodiments, bottoms of unfilled portions of the openings 1003 may be above the topmost surface of the integrated circuit dies 801. In some embodiments, bottoms of unfilled portions of the openings 1003 may be substantially level with the topmost surface of the integrated circuit dies 801.

Figure 13:
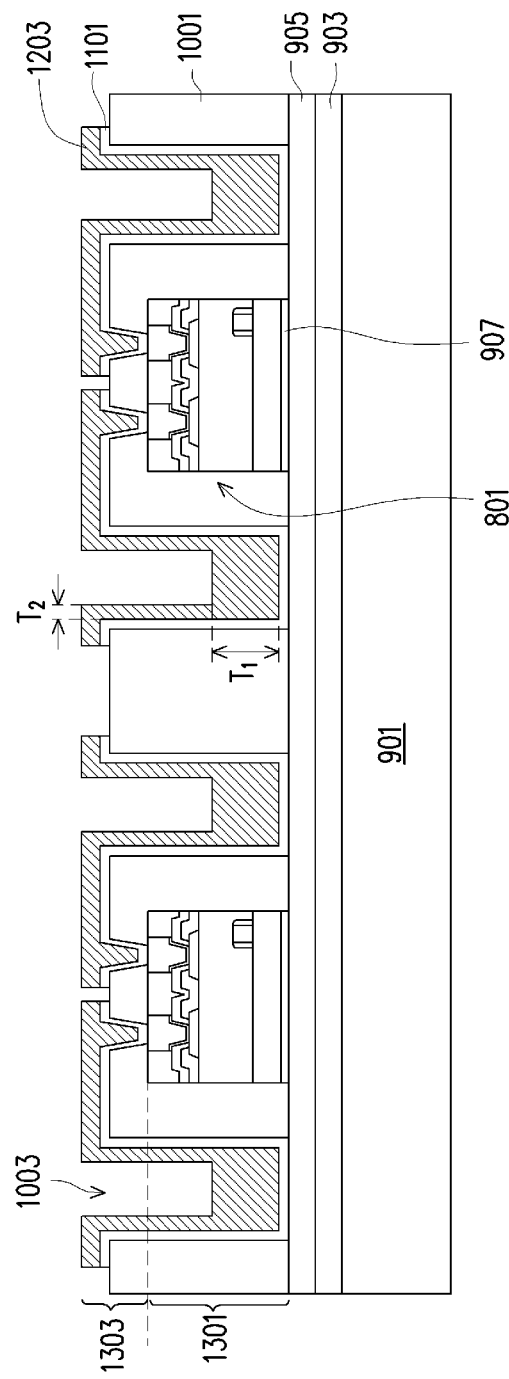

Referring to FIG. 13, after forming the conductive material 1203, the patterned mask 1201 (see FIG. 12) is removed. In some embodiments, the patterned mask 1201 may be removed using similar methods as the patterned mask 401 described above with reference to FIG. 6, and the description is not repeated herein for the sake of brevity. Subsequently, exposed portions of the seed layer 1101 are removed. In some embodiments, the exposed portions of the seed layer 1101 may be removed using similar methods as the exposed portions of the seed layer 301 described above with reference to FIG. 6, and the description is not repeated herein for the sake of brevity. In some embodiments, portions of the seed layer 1101 and the conductive material 1203 disposed in the openings 1003 below a topmost surface of the integrated circuit dies 801 may be referred to as conductive vias 1301 or through encapsulant conductive vias 1301. In some embodiments, portions of the seed layer 1101 and the conductive material 1203 above the topmost surface of the integrated circuit dies 801 may be referred to as a redistribution layer (RDL) 1303. By forming the conductive vias 1301 and the RDL 1303 in a same process step, the number of process steps for forming a resulting package and manufacturing costs are reduced. As described below in greater detail, connectors (such as connectors 1603 illustrated in FIG. 16) are formed in contact with bottom surfaces of the conductive vias 1301. In some embodiments where the conductive material 1203 is conformally formed in the openings 1003, a thickness of the conductive material 1203 at the bottoms of the openings 1003 may be less than the desired thickness, such that the entirety of the conductive material 1203 disposed on the bottoms of the openings 1003 may be exhausted by an intermetallic compound (IMC) formed at interfaces between the conductive vias 1301 and the connectors, which may increase the possibility of crack formation at the interfaces between the conductive vias 1301 and the connectors. On the other hand, by fully filling the openings 1003 with the conductive material 1203 to achieve the desired thickness at the bottoms of the openings 1003, a deposition time (such as, for example, a plating time) for the conductive material 1203 may be greater than desired, may increase the production cost and decrease a wafer-per-hour (WPH) yield. By non-conformally forming the conductive vias 1301 to have the thickness $T_1$ at the bottoms of the openings 1003 as described above, the conductive material 1203 may not be exhausted by the IMC formed at the interfaces between the conductive vias 1301 and the connectors and the deposition time for the conductive material 1203 may be reduced. Accordingly, the possibility of crack formation at the interfaces between the conductive vias 1301 and the connectors may be reduced or eliminated, the production cost may be reduced and the WPH yield may be increased.

Figure 14:
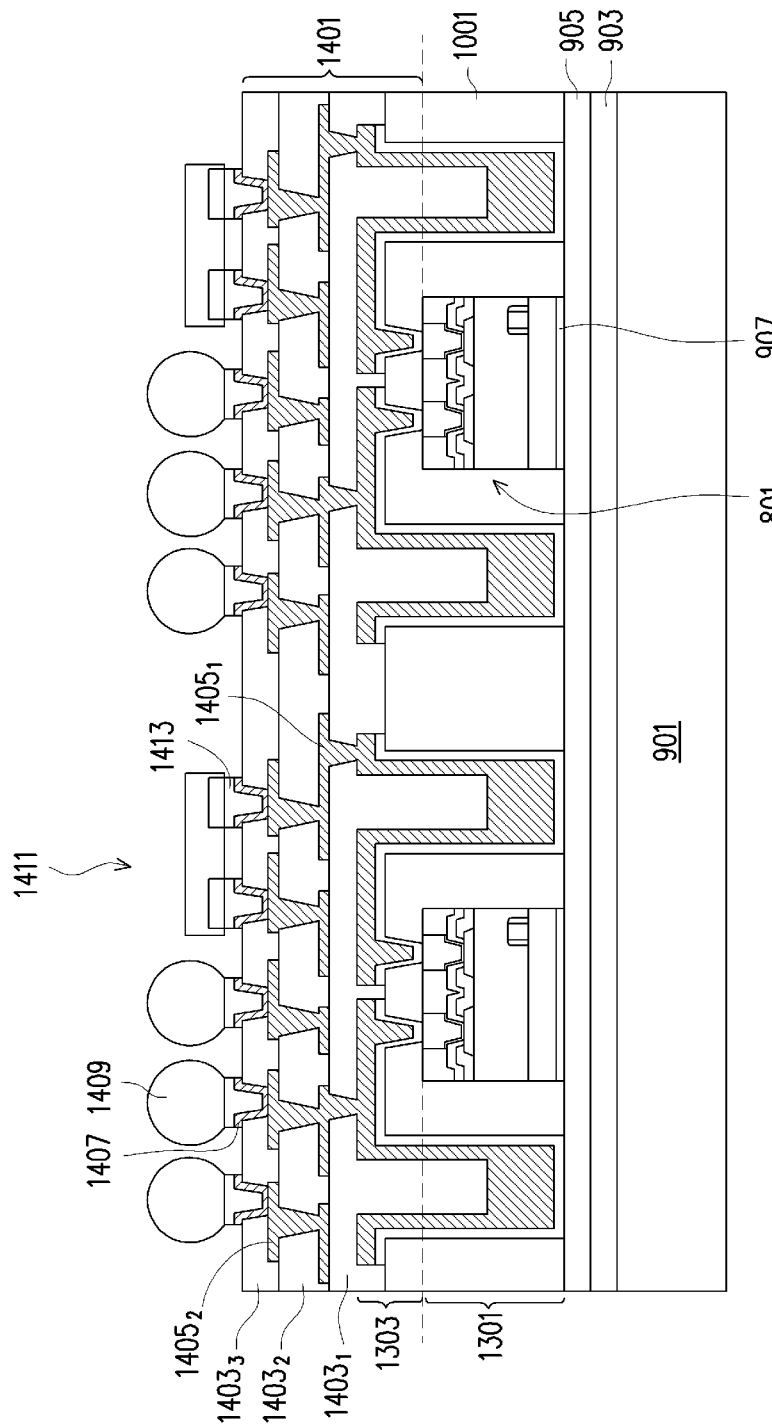

Referring to FIG. 14, a redistribution structure 1401 is formed over the integrated circuit dies 801 and the encapsulant 1001. In some embodiments, the RDL 1303 may be the first RDL layer of the redistribution structure 1401. In some embodiments, the redistribution structure 1401 may further comprise insulating layers $1403_1$-$1403_3$, and RDLs $1405_1$ and $1405_2$ (comprising conductive lines and vias) disposed within the insulating layers $1403_1$-$1403_3$. In some embodiments, the insulating layers $1403_1$-$1403_3$ may be formed using similar materials and methods as the buffer layer 201 described above with reference to FIG. 2, and the description is not repeated herein for the sake of brevity. In some embodiments, the RDLs $1405_1$ and $1405_2$ may be formed using similar materials and methods as the RDL 1303 described above with reference to FIG. 13, and the description is not repeated herein for the sake of brevity.

Referring further to FIG. 14, in some embodiments, process steps for forming the redistribution structure 1401 may include patterning the insulating layer $1403_1$ to form openings therein using similar method as, for example, the buffer layer 201 described above with reference to FIG. 2, and the description is not repeated herein for the sake of brevity. The RDL $1405_1$ is formed over the insulating layer $1403_1$ and in the openings in the insulating layer $1403_1$ to contact the RDL 1303. The RDL $1405_1$ may comprise various lines/traces (running "horizontally" across a top surface of the insulating layer $1403_1$) and/or vias (extending "vertically" into the insulating layer $1403_1$). In some embodiments, a seed layer (not shown) is deposited over the insulating layer $1403_1$ and in the openings within over the insulating layer $1403_1$. The seed layer may be formed using similar materials and methods as the seed layer 301 described above with reference to FIG. 3, and the description is not repeated herein for the sake of brevity. Subsequently, a patterned mask (not shown) is deposited over the seed layer to define the desired pattern for the RDL $1405_1$. In some embodiments, the patterned mask having openings therein may be formed using similar materials and methods as the patterned mask 401 described above with reference to FIG. 4, and the description is not repeated herein for the sake of brevity. In some embodiments, a conductive material is formed on the seed layer by an electro-chemical plating process, an electroless plating process, ALD, PVD, a combination thereof, or the like. Subsequently, the patterned mask is removed and portions of the seed layer exposed after removing the patterned mask are also removed. In some embodiments, the patterned mask may be removed using similar methods as the patterned mask 401 described above with reference to FIG. 6, and the description is not repeated herein for the sake of brevity. In some embodiments, exposed portions of the seed layer may be removed using similar methods as the exposed portions of the seed layer 301 described above with reference to FIG. 6, and the description is not repeated herein for the sake of brevity.

Referring further to FIG. 14, the insulating layer $1403_2$, the RDL $1405_2$, and the insulating layer $1403_3$ are formed over the insulating layer $1403_1$ and the RDL $1405_1$, which completes the formation of the redistribution structure 1401. In some embodiments, the RDL $1405_2$ may be formed over the insulating layer $1403_2$ using similar methods as the RDL $1405_1$ and the description is not repeated herein for the sake of brevity. In some embodiments, the RDL $1405_2$ extends through the insulating layer $1403_2$ and contacts portions of the RDL $1405_1$.

As shown in FIG. 14, the redistribution structure 1401 comprises three RDLs (such as the RDLs 1303, $1405_1$ and $1405_2$). One skilled in the art will recognize that the number of RDLs are provided for illustrative purpose only and are not limiting the scope of the present disclosure. In other embodiments, the redistribution structure 1401 may comprise appropriate number of RDLs depending on design requirements for the resulting packaged device.

Referring further to FIG. 14, underbump metallizations (UBMs) 1407 are formed over and electrically coupled to the redistribution structure 1401. In some embodiments, a set of openings may be formed through the insulating layer $1403_3$ to expose portions of the RDL $1405_2$. In some embodiments, the UBMs 1407 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 1407. Any suitable materials or layers of material that may be used for the UBMs 1407 are fully intended to be included within the scope of the current application. In some embodiments, connectors 1409 are formed over and electrically coupled to some of the UBMs 1407. In some embodiments, the connectors 1409 may be solder balls, controlled collapse chip connection (C4) bumps, ball grid array (BGA) balls, micro bumps, electroless nickel-electroless palladium-immersion gold technique (ENEPIG) formed bumps, or the like. In some embodiments where the connectors 1409 are formed of solder materials, a reflow process may be performed in order to shape the solder material into the desired bump shapes. In other embodiments, the connectors 1409 may be conductive pillars, which may be formed using similar materials and methods as the conductive pillars 501 described above reference to FIG. 5, and the description is not repeated herein for the sake of brevity. In some embodiments where the connectors 1409 comprise conductive pillars, the connectors 1409 may further comprise cap layers that may be formed on the top of the conductive pillars. In some embodiments, the cap layers may comprise a solder, nickel, tin, tin-lead, gold, silver, palladium, indium, nickel-palladium-gold, nickel-gold, the like, a combination thereof, or the like, and may be formed using an electro-chemical plating process, an electroless plating process, or the like.

Referring further to FIG. 14, integrated circuit dies 1411 are mounted over and electrically coupled to the redistribution structure 1401. In some embodiments, the integrated circuit dies 1411 are attached to the UBMs 1407 using connectors 1413. In some embodiments, the connectors 1413 may be formed using similar materials and methods as the connectors 1409 and the description is not repeated herein for the sake of brevity. In some embodiments, integrated circuit dies 1411 may be discrete semiconductor device chips, such as surface mount devices (SMDs), integrated passive devices (IPDs), or the like.

Figure 15:
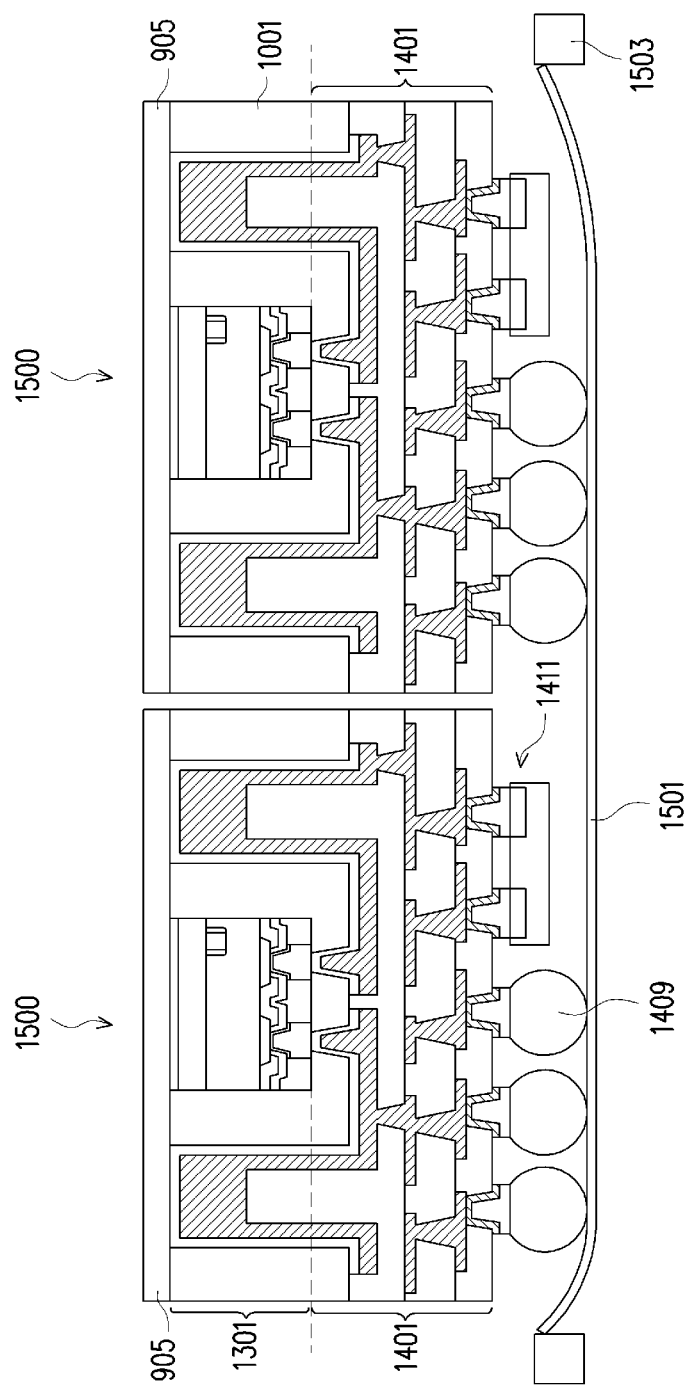

Referring to FIG. 15, after forming the connectors 1409 over the redistribution structure 1401 and attaching the integrated circuit dies 1411 to the redistribution structure 1401, the resulting structure is attached to a tape 1501 supported by a frame 1503 such that the connectors 1409 contact the tape 1501. In some embodiment, the tape 1501 may comprise a die attach film, a dicing tape, or the like. Subsequently, the carrier 901 (see FIG. 14) is detached from the resulting structure to expose the insulating layer 905. Subsequently, the resulting structure may be diced to form individual integrated circuit packages 1500. In some embodiments, the resulting structure may be diced by sawing, a laser ablation method, a combination thereof, or the like. Subsequently, each of the integrated circuit packages 1500 may be tested to identify known good packages (KGPs) for further processing.

Figure 16:
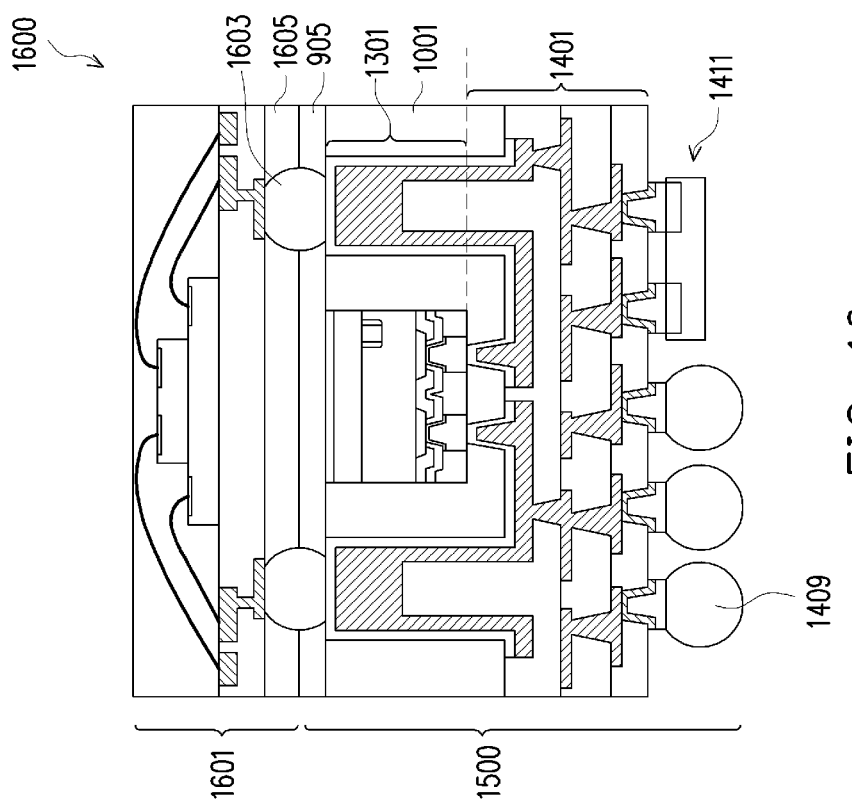

Referring to FIG. 16, in some embodiments, a workpiece 1601 is bonded to the integrated circuit package 1500 with a set of connectors 1603 extending through openings in the insulating layer 905 to form a stacked semiconductor device 1600. In some embodiments, the openings in the insulating layer 905 may be formed using, for example, a laser ablation method. In some embodiments where the insulating layer 905 is formed of a photo-patternable material, the openings may be formed using photolithography methods. In some embodiments, the workpiece 1601 may be a package, one or more dies, a printed circuit board (PCB), a package substrate, an interposer, or the like. In some embodiments wherein the workpiece 1601 is a package, the stacked semiconductor device 1600 is a package-on package (PoP) device. In other embodiments wherein the workpiece 1601 is a die, the stacked semiconductor device 1600 is a chip-on-package (CoP) device. In some embodiments, the connectors 1603 may be formed using similar material and methods as the connectors 1409 described above with reference to FIG. 14, and the description is not repeated herein for the sake of brevity. In other embodiments, the workpiece 1601 may be bonded to the integrated circuit package 1500 before the dicing process described above with reference to FIG. 15.

Referring further to FIG. 16, an underfill 1605 may be injected or otherwise formed in the space between the workpiece 1601 and the integrated circuit package 1500 and surrounding the connectors 1603. The underfill 1605 may, for example, be a liquid epoxy, deformable gel, silicon rubber, or the like, that is dispensed between the structures, and then cured to harden. The underfill 1605 may be used, among other things, to reduce damage to and to protect the connectors 1603. In some embodiments, the underfill 1605 and the encapsulant 1001 may comprise a same material. In other embodiments, the underfill 1605 and the encapsulant 1001 may comprise different materials.

Figure 17:
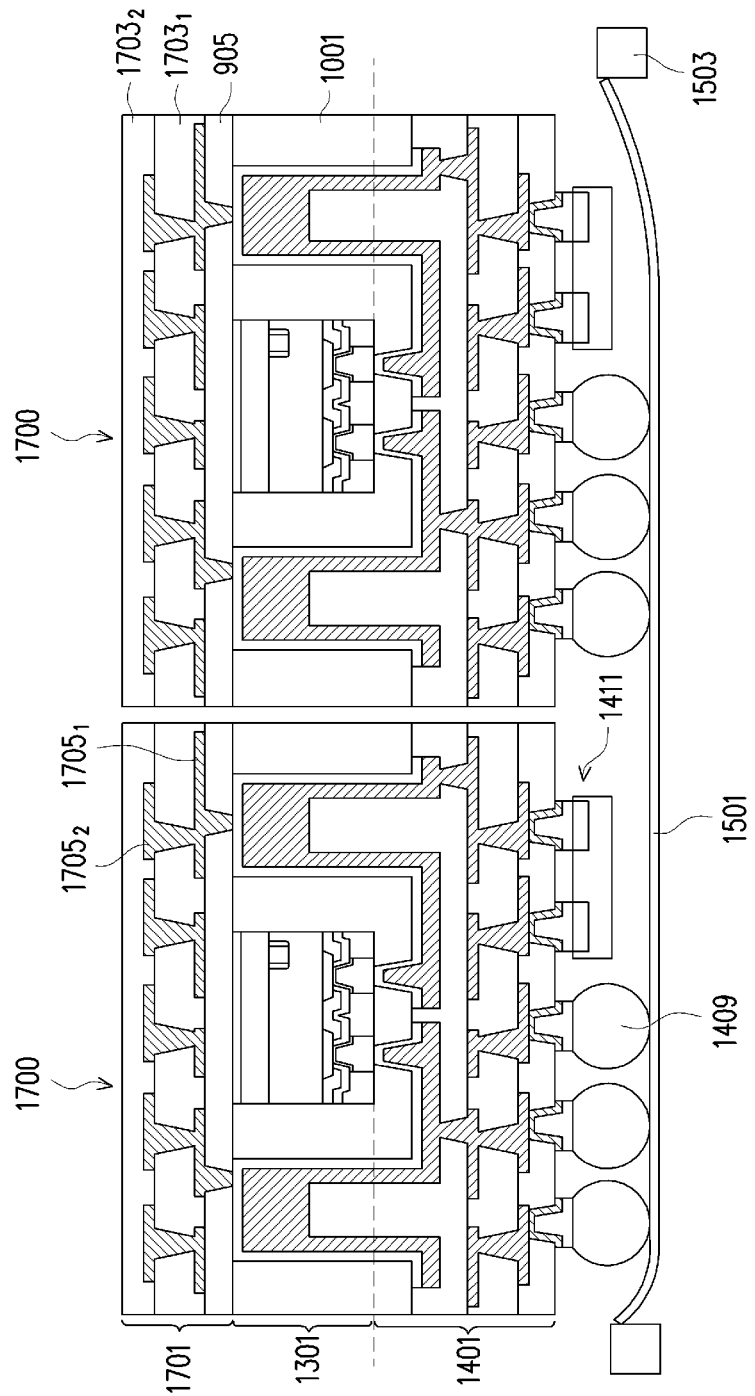
FIGS. 17 and 18 are cross-sectional views of various processing steps during fabrication of integrated circuit packages in accordance with some embodiments.

Referring to FIG. 17, in some embodiments, after detaching the carrier 901 and before the dicing process as described above with reference to FIG. 15, a redistribution structure 1701 is formed over the insulating layer 905. In some embodiments, the insulating layer 905 may be a first insulating layer of the redistribution structure 1701. In the illustrated embodiment, the redistribution structure 1701 further comprises insulating layers $1703_1$ and $1703_2$, and RDLs $1705_1$ and $1705_2$. In some embodiments, the insulating layers $1703_1$ and $1703_3$ may be formed using similar materials and methods as the buffer layer 201 described above with reference to FIG. 2, and the description is not repeated herein for the sake of brevity. In some embodiments, the RDLs $1705_1$ and $1705_2$ may be formed using similar materials and methods as the RDL 1303 described above with reference to FIG. 13, and the description is not repeated herein for the sake of brevity. In some embodiments, the redistribution structure 1701 may be formed using similar methods as the redistribution structure 1401 described above with reference to FIG. 14, and the description is not repeated herein for the sake of brevity. One skilled in the art will recognize that the number of RDLs and insulating layers are provided for illustrative purpose only and are not limiting the scope of the present disclosure. In other embodiments, the redistribution structure 1701 may comprise appropriate number of RDLs and insulating layers depending on design requirements for the resulting packaged device.

Referring further to FIG. 17, in some embodiments, after forming the redistribution structure 1701, the resulting structure is attached to a tape 1501 supported by a frame 1503 such that the connectors 1409 contact the tape 1501. Subsequently, the resulting structure may be diced to form individual integrated circuit packages 1700. In some embodiments, the resulting structure may be diced by sawing, a laser ablation method, a combination thereof, or the like. Subsequently, each of the integrated circuit packages 1700 may be tested to identify known good packages (KGPs) for further processing.

Figure 18:
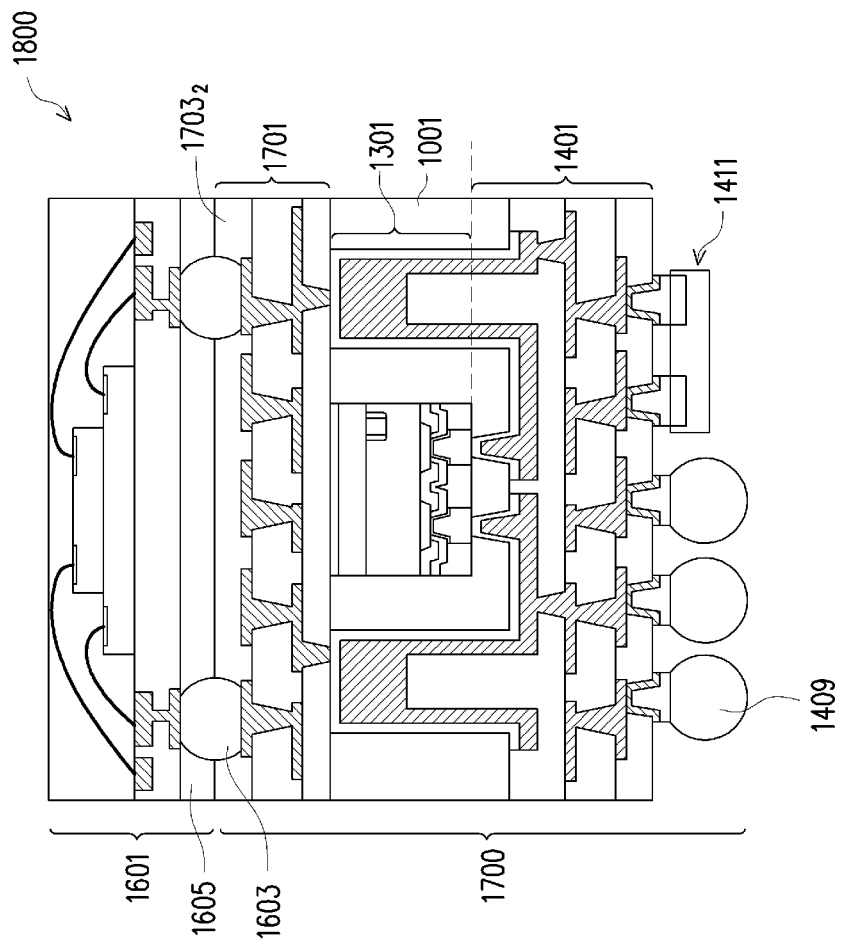

Referring to FIG. 18, in some embodiments, a workpiece 1601 is bonded to the integrated circuit package 1700 with a set of connectors 1603 extending through openings in the insulating layer $1703_2$ to form a stacked semiconductor device 1800. In some embodiments, the stacked semiconductor device 1800 is similar to the stacked semiconductor device 1600, with like elements labeled using like numerical references. In some embodiments, the stacked semiconductor device 1800 may be formed using similar methods as the stacked semiconductor device 1600 described above with reference to FIG. 16, and the description is not repeated herein for the sake of brevity.

Figure 19:
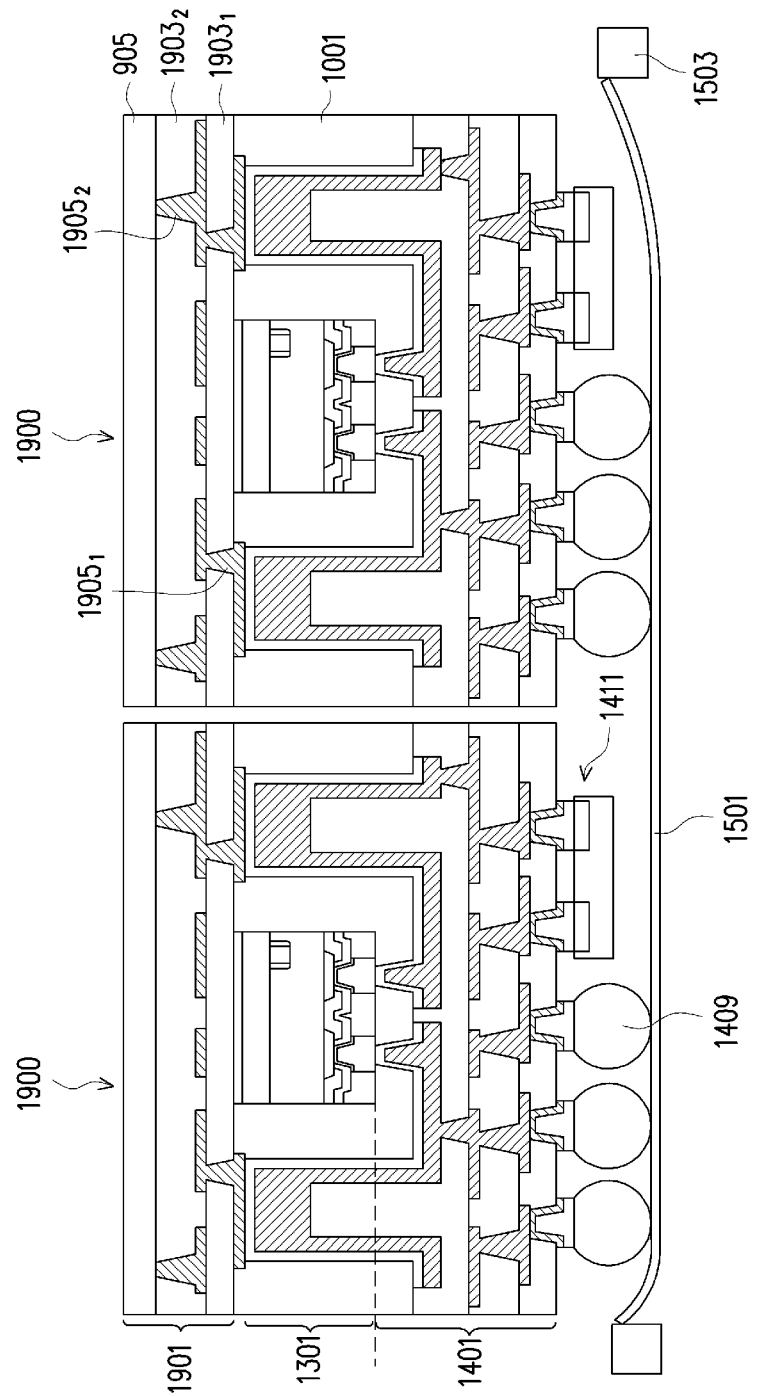
FIGS. 19 and 20 are cross-sectional views of various processing steps during fabrication of integrated circuit packages in accordance with some embodiments.

Referring to FIG. 19, in some embodiments, after forming the insulating layer 905 over the carrier 901 and before attaching the integrated circuit dies 801 as described above with reference to FIG. 9, a redistribution structure 1901 is formed over the carrier 901. In some embodiments, after forming the redistribution structure 1901, the process steps described above with reference to FIGS. 9-14 may be performed to form the structure illustrated in FIG. 19. In some embodiments, the insulating layer 905 may be a first insulating layer of the redistribution structure 1901. In the illustrated embodiment, the redistribution structure 1901 further comprises insulating layers $1903_1$ and $1903_2$, and RDLs $1905_1$ and $1905_2$. In some embodiments, the insulating layers $1903_1$ and $1903_3$ may be formed using similar materials and methods as the buffer layer 201 described above with reference to FIG. 2, and the description is not repeated herein for the sake of brevity. In some embodiments, the RDLs $1905_1$ and $1905_2$ may be formed using similar materials and methods as the RDL 1303 described above with reference to FIG. 13, and the description is not repeated herein for the sake of brevity. In some embodiments, the redistribution structure 1901 may be formed using similar methods as the redistribution structure 1401 described above with reference to FIG. 14, and the description is not repeated herein for the sake of brevity. One skilled in the art will recognize that the number of RDLs and insulating layers are provided for illustrative purpose only and are not limiting the scope of the present disclosure. In other embodiments, the redistribution structure 1901 may comprise appropriate number of RDLs and insulating layers depending on design requirements for the resulting packaged device. Subsequently, the resulting structure may be diced to form individual integrated circuit packages 1900. In some embodiments, the resulting structure may be diced by sawing, a laser ablation method, a combination thereof, or the like. Subsequently, each of the integrated circuit packages 1900 may be tested to identify known good packages (KGPs) for further processing.

Figure 20:
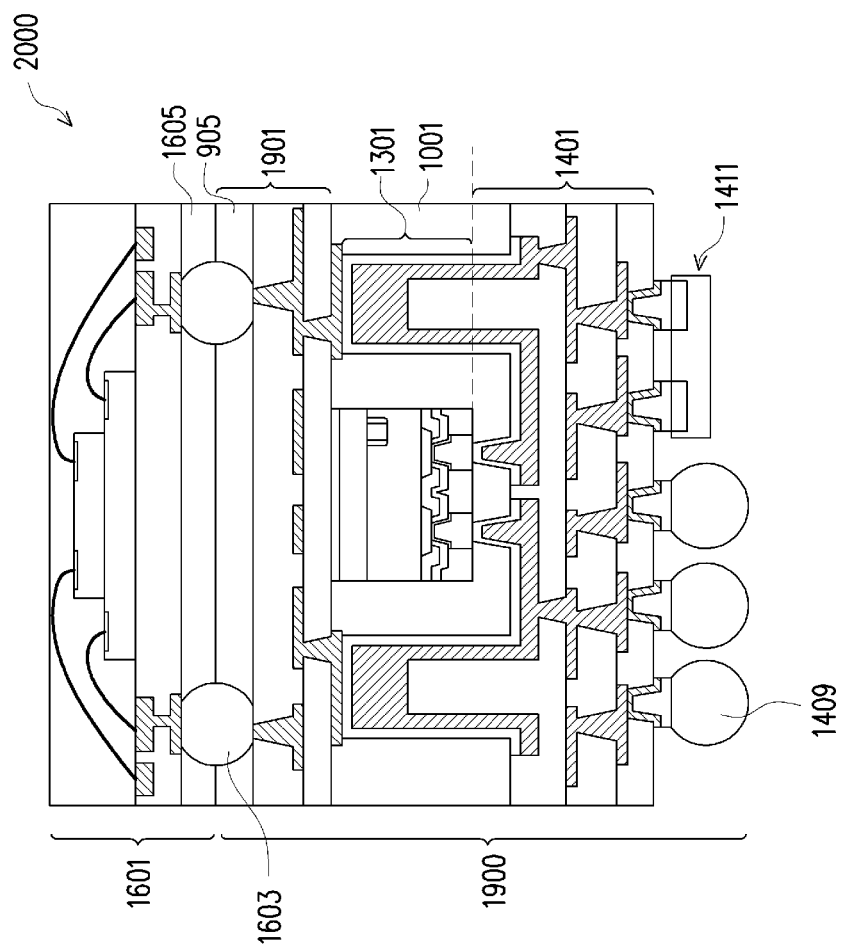

Referring to FIG. 20, in some embodiments, a workpiece 1601 is bonded to the integrated circuit package 1900 with a set of connectors 1603 extending through openings in the insulating layer 905 to form a stacked semiconductor device 2000. In some embodiments, the stacked semiconductor device 2000 is similar to the stacked semiconductor device 1600, with like elements labeled using like numerical references. In some embodiments, the stacked semiconductor device 2000 may be formed using similar methods as the stacked semiconductor device 1600 described above with reference to FIG. 16, and the description is not repeated herein for the sake of brevity.

Figure 21:
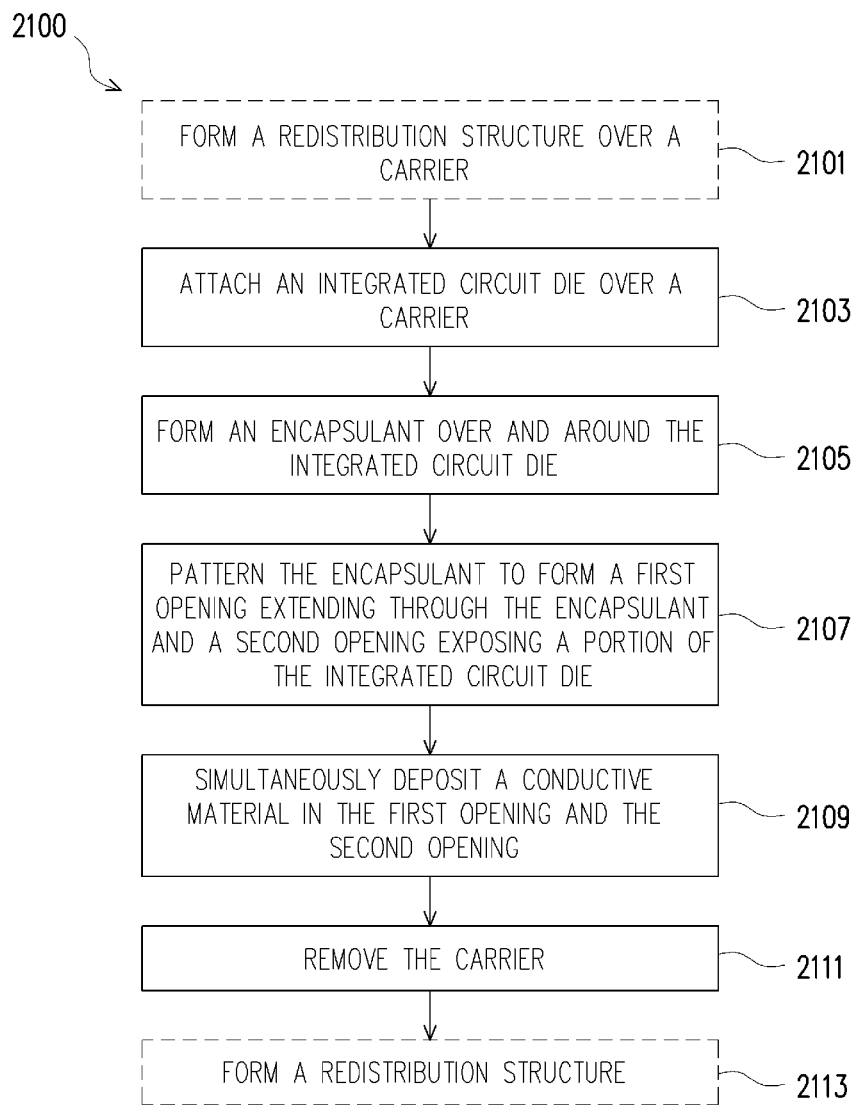
FIG. 21 is a flow diagram illustrating a method of forming of an integrated circuit package in accordance with some embodiments.

FIG. 21 is a flow diagram illustrating a method 2100 of forming of an integrated circuit package in accordance with some embodiments. In some embodiments, the method 2100 starts with step 2103, where an integrated circuit die (such as the integrated circuit die 801 illustrated in FIG. 9) is attached over a carrier (such as the carrier 901 illustrated in FIG. 9) as described above with reference to FIG. 9. In step 2105, an encapsulant (such as the encapsulant 1001 illustrated in FIG. 10) is formed over and around the integrated circuit die as described above with reference to FIG. 10. In step 2107, the encapsulant is patterned to form a first opening (such as the opening 1003 illustrated in FIG. 10) extending through the encapsulant and a second opening (such as the opening 1005 illustrated in FIG. 10) exposing a portion of the integrated circuit die as described above with reference to FIG. 10. In step 2109, a conductive material (such as the conductive material 1203 illustrated in FIG. 12) is simultaneously deposited in the first opening and the second opening as described above with reference to FIG. 12. In step 2111, the carrier is removed as described above with reference to FIG. 15. In alternative embodiments, prior to performing step 2103, step 2101 is performed, where a redistribution structure (such as the redistribution structure 1901 illustrated in FIG. 19) is formed over the carrier as described above with reference to FIG. 19. In yet other alternative embodiments, after performing step 2111, step 2113 is performed, where a redistribution structure (such as the redistribution structure 1701 illustrated in FIG. 17) is formed as described above with reference to FIG. 17.

According to an embodiment, a method includes attaching a first side of an integrated circuit die to a carrier; forming an encapsulant over and around the integrated circuit die; patterning the encapsulant to form a first opening laterally spaced apart from the integrated circuit die and a second opening over the integrated circuit die, the first opening extending through the encapsulant, the second opening exposing a second side of the integrated circuit die, the first side of the integrated circuit die being opposite the second side of the integrated circuit die; and simultaneously depositing a conductive material in the first opening and the second opening. In an embodiment, the method further includes, before attaching the integrated circuit die to the carrier, forming a redistribution structure over the carrier. In an embodiment, the method further includes removing the carrier from the first side of the integrated circuit die; and forming a redistribution structure over the first side of the integrated circuit die. In an embodiment, the conductive material partially fills the first opening. In an embodiment, a thickness of the conductive material over a bottom of the first opening is greater than a thickness of the conductive material along sidewalls of the first opening. In an embodiment, the conductive material overfills the second opening. In an embodiment, the method further includes, after simultaneously depositing the conductive material in the first opening and the second opening, depositing an insulating material in the first opening, the insulating material overfilling the first opening.

According to another embodiment, a method includes attaching a first side of an integrated circuit die to a carrier, a second side of the integrated circuit die having a contact pad, the first side of the integrated circuit die being opposite the second side of the integrated circuit die; forming an encapsulant over and around the integrated circuit die; and simultaneously forming a conductive via and a first redistribution layer (RDL) in the encapsulant, the conductive via being laterally spaced apart from a sidewall of the integrated circuit die, a top surface of the conductive via being below a topmost surface of the encapsulant, the first RDL being over the second side of the integrated circuit die, the first RDL being in electrical contact with the contact pad. In an embodiment, the method further includes, before attaching the integrated circuit die to the carrier, forming a second RDL over the carrier. In an embodiment, the method further includes detaching the carrier from the first side of the integrated circuit die; and forming a second RDL over the first side of the integrated circuit die. In an embodiment, simultaneously forming the conductive via and the first RDL in the encapsulant includes patterning the encapsulant to form a first opening and a second opening in the encapsulant, the first opening extending through the encapsulant, the second opening exposing the second side of the integrated circuit die; and simultaneously non-conformally depositing a conductive material in the first opening and the second opening. In an embodiment, a thickness of the conductive material over a bottom of the first opening is greater than a thickness of the conductive material along sidewalls of the first opening. In an embodiment, a thickness of the conductive material over a bottom of the first opening is less than a height of the integrated circuit die. In an embodiment, the encapsulant comprises a photo-patternable insulating material.

According to yet another embodiment, a structure includes an integrated circuit die; an encapsulant extending along a sidewall and a topmost surface of the integrated circuit die; a conductive via in the encapsulant, the conductive via being spaced apart from the sidewall of the integrated circuit die; and an insulating layer over the conductive via. In an embodiment, the conductive via includes a first portion extending along a bottom surface the insulating layer; and a second portion extending along a sidewall of the insulating layer, a height of the first portion being greater than a width of the second portion. In an embodiment, the structure further includes a redistribution layer over a topmost surface of the encapsulant, at least a portion of the redistribution layer extending into the encapsulant and contacting the conductive via. In an embodiment, a bottommost surface of the conductive via is substantially level with a bottommost surface of the encapsulant. In an embodiment, at least a portion of the insulating layer is below a topmost surface of the encapsulant. In an embodiment, an interface between the conductive via and the insulating layer is below the topmost surface of the integrated circuit die. In an embodiment, the encapsulant comprises a photo-patternable insulating material.

According to yet another embodiment, a method includes: forming a first insulating layer over a carrier; attaching a first side of an integrated circuit die to the first insulating layer, the integrated circuit die having a second side opposite the first side; encapsulating the integrated circuit die in a second insulating layer; forming a first recess and a second recess in the second insulating layer, the first recess exposing the first insulating layer, the second recess exposing the second side of the integrated circuit die; and simultaneously depositing a conductive material in the first recess and the second recess.

According to yet another embodiment, a method includes: attaching a first side of an integrated circuit die to a carrier, a second side of the integrated circuit die having a connector, the first side of the integrated circuit die being opposite the second side of the integrated circuit die; forming a first insulating layer over and around the integrated circuit die; and simultaneously forming a conductive via and a first redistribution layer (RDL) in the first insulating layer, a sidewall of the conductive via facing a sidewall of the integrated circuit die, a top surface of the conductive via being below a topmost surface of the first insulating layer, the first RDL being in physical contact with the connector, where simultaneously forming the conductive via and the first RDL in the first insulating layer includes: patterning the first insulating layer to form a first recess and a second recess in the first insulating layer, the first recess extending through the first insulating layer, the second recess exposing a topmost surface of the connector; forming a patterned mask over the first insulating layer, the patterned mask exposing the first recess and the second recess; and simultaneously non-conformally depositing a conductive material in the first recess and the second recess through the patterned mask.

According to yet another embodiment, a method includes: depositing a first insulating layer over a carrier; attaching a first side of an integrated circuit die to the first insulating layer, a second side of the integrated circuit die having a connector, the second side of the integrated circuit die facing away from the first insulating layer; depositing a second insulating layer over the first insulating layer, the second insulating layer extending along a sidewall of the integrated circuit die and covering the connector; and simultaneously forming a conductive column and a first redistribution layer (RDL), the conductive column extending through the second insulating layer and physically contacting the first insulating layer, a portion of the first RDL extending into the second insulating layer and physically contacting the connector, where simultaneously forming the conductive column and the first RDL includes: patterning the second insulating layer to form a first recess and a second recess in the second insulating layer, the first recess exposing the first insulating layer, the second recess exposing a topmost surface of the connector; depositing a first conductive material in the first recess and the second recess; forming a patterned mask over the first conductive material, the patterned mask exposing a first portion of the first conductive material in the first recess and a second portion of the first conductive material in the second recess; and simultaneously non-conformally depositing a second conductive material in the first recess and the second recess through the patterned mask.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a first insulating layer over a carrier;
forming a first redistribution layer (RDL) over the first insulating layer;
forming a second insulating layer over the first insulating layer and the first RDL;
forming a second RDL over the second insulating layer, a topmost surface of the second RDL being above a topmost surface of the second insulating layer, a portion of the second RDL extending through the second insulating layer and physically contacting the first RDL;
attaching a first side of an integrated circuit die to the second insulating layer, a second side of the integrated circuit die having a connector, the first side of the integrated circuit die being opposite to the second side of the integrated circuit die;
after attaching the first side of the integrated circuit die to the second insulating layer, forming a third insulating layer over and around the integrated circuit die, the third insulating layer being in physical contact with the topmost surface of the second RDL and the topmost surface of the second insulating layer;
simultaneously forming a conductive via and a third RDL in the third insulating layer, a sidewall of the conductive via facing a sidewall of the integrated circuit die, a top surface of the conductive via being below a topmost surface of the third insulating layer, the third RDL being in physical contact with the connector, wherein simultaneously forming the conductive via and the third RDL in the third insulating layer comprises:
patterning the third insulating layer to form a first recess and a second recess in the third insulating layer, the first recess extending through the third insulating layer and exposing the topmost surface of the second RDL, the second recess exposing a topmost surface of the connector;
forming a patterned mask over the third insulating layer, the patterned mask exposing the first recess and the second recess; and
simultaneously non-conformally depositing a conductive material in the first recess and the second recess through the patterned mask; and
removing the carrier to expose the first insulating layer.

2. The method of claim 1, wherein a thickness of the conductive material over a bottom of the first recess is greater than a thickness of the conductive material along sidewalls of the first recess.

3. The method of claim 1, wherein the third insulating layer comprises a photo-patternable insulating material.

4. The method of claim 1, wherein simultaneously forming the conductive via and the third RDL in the third insulating layer further comprises, after simultaneously non-conformally depositing the conductive material in the first recess and the second recess through the patterned mask, removing the patterned mask.

5. The method of claim 4, wherein simultaneously forming the conductive via and the third RDL in the third insulating layer further comprises, before forming the patterned mask over the third insulating layer, simultaneously depositing a seed layer in the first recess and the second recess.

6. The method of claim 5, wherein simultaneously forming the conductive via and the third RDL in the third insulating layer further comprises, after removing the patterned mask, removing a portion of the seed layer not covered by the conductive material.

7. A method comprising:
forming a first insulating layer over a carrier;
forming a first redistribution layer (RDL) over the first insulating layer;
forming second insulating layer over the first insulating layer and the first RDL;
forming a second RDL over the second insulating layer, a first portion of the second RDL extending along a topmost surface of the second insulating layer, a second portion of the second RDL extending through the second insulating layer and physically contacting the first RDL;
attaching a first side of an integrated circuit die to the topmost surface of the second insulating layer, the integrated circuit die having a second side opposite the first side;
after attaching the first side of the integrated circuit die to the topmost surface of the second insulating layer, encapsulating the integrated circuit die in a third insulating layer, the third insulating layer being in physical contact with a sidewall and a topmost surface of the first portion of the second RDL;
forming a first recess and a second recess in the third insulating layer, the first recess exposing the first portion of the second RDL, the second recess exposing the second side of the integrated circuit die;
simultaneously depositing a first conductive material in the first recess and the second-recess; and
removing the carrier from the first insulating layer.

8. The method of claim 7, further comprising:
forming a patterned mask over the first conductive material, the patterned mask exposing a first portion of the first conductive material in the first recess and a second portion of the first conductive material in the second recess; and
simultaneously non-conformally depositing a second conductive material in the first recess and the second recess through the patterned mask.

9. The method of claim 8, further comprising, after simultaneously depositing the second conductive material in the first recess and the second recess, forming a third RDL over the second side of the integrated circuit die.

10. The method of claim 8, wherein the second conductive material partially fills the first recess.

11. The method of claim 10, wherein a thickness of the second conductive material over a bottom of the first recess is greater than a thickness of the second conductive material along sidewalls of the first recess.

12. The method of claim 8, wherein the second conductive material overfills the second recess.

13. The method of claim 8, further comprising, after simultaneously non-conformally depositing the second conductive material in the first recess and the second recess through the patterned mask, depositing a fourth insulating layer over the second conductive material, a bottommost surface of the fourth insulating layer being below a topmost surface of the third insulating layer.

14. A method comprising:
depositing a first insulating layer over a carrier;
forming a first redistribution layer (RDL) over the first insulating layer;
depositing second insulating layer over the first insulating layer and the first RDL;
forming a second RDL over the second insulating layer, a first portion of the second RDL being in physical contact with a topmost surface of the second insulating layer, a second portion of the second RDL extending through the second insulating layer and physically contacting the first RDL;
attaching a first side of an integrated circuit die to the second insulating layer, a second side of the integrated circuit die having a connector, the second side of the integrated circuit die facing away from the second insulating layer;
after attaching the first side of the integrated circuit die to the second insulating layer, depositing a third insulating layer over and in physical contact with the second insulating layer, the third insulating layer extending along a sidewall of the integrated circuit die and covering the connector;
simultaneously forming a conductive via and a third RDL in the third insulating layer, the conductive via extending through the third insulating layer and physically contacting the first portion of the second RDL, a portion of the third RDL extending into the third insulating layer and physically contacting the connector, wherein simultaneously forming the conductive via and the third RDL comprises:
patterning the third insulating layer to form a first recess and a second recess in the third insulating layer, the first recess exposing the first portion of the second RDL, the second recess exposing a topmost surface of the connector;
depositing a first conductive material in the first recess and the second recess;
forming a patterned mask over the first conductive material, the patterned mask exposing a first portion of the first conductive material in the first recess and a second portion of the first conductive material in the second recess; and
simultaneously non-conformally depositing a second conductive material in the first recess and the second recess through the patterned mask, the second conductive material being different from the first conductive material; and
detaching the carrier from the first insulating layer.

15. The method of claim 14, further comprising:
depositing a fourth insulating layer over the conductive via and the third RDL, a bottommost surface of the fourth insulating layer being below the topmost surface of the connector; and forming a fourth RDL over the fourth insulating layer, a portion of the fourth RDL extending into the fourth insulating layer and physically contacting the third RDL.

16. The method of claim 15, further comprising electrically coupling a surface mount device to the fourth RDL.

17. The method of claim 14, wherein the second conductive material partially fills the first recess and overfills the second recess.

18. The method of claim 14, wherein simultaneously forming the conductive via and the third RDL further comprises:
   after simultaneously non-conformally depositing the second conductive material, removing the patterned mask; and
   after removing the patterned mask, removing exposed portions of the first conductive material.

19. The method of claim 7, further comprising, after removing the carrier, patterning the first insulating layer to expose portions of the first RDL.

20. The method of claim 14, further comprising, after detaching the carrier, forming a plurality of openings in the first insulating layer, the plurality of openings exposing the first RDL.

* * * * *